US008679268B2

(12) United States Patent
Ogino et al.

(10) Patent No.: US 8,679,268 B2
(45) Date of Patent: *Mar. 25, 2014

(54) SPUTTERING TARGET OF FERROMAGNETIC MATERIAL WITH LOW GENERATION OF PARTICLES

(75) Inventors: Shin-ichi Ogino, Ibaraki (JP); Atsushi Sato, Ibaraki (JP); Yuichiro Nakamura, Ibaraki (JP); Atsutoshi Arakawa, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 216 days.

This patent is subject to a terminal disclaimer.

(21) Appl. No.: 13/320,840

(22) PCT Filed: Sep. 30, 2010

(86) PCT No.: PCT/JP2010/067179
§ 371 (c)(1),
(2), (4) Date: Nov. 16, 2011

(87) PCT Pub. No.: WO2012/011204
PCT Pub. Date: Jan. 26, 2012

(65) Prior Publication Data
US 2012/0097535 A1    Apr. 26, 2012

(30) Foreign Application Priority Data

Jul. 20, 2010 (JP) .................................. 2010-163296

(51) Int. Cl.
C23C 14/06 (2006.01)
C23C 14/34 (2006.01)
H01F 41/18 (2006.01)
C22C 19/07 (2006.01)

(52) U.S. Cl.
CPC ........... *C23C 14/3414* (2013.01); *H01F 41/183* (2013.01); *C22C 19/07* (2013.01)
USPC ........................ 148/425; 148/427; 204/298.13

(58) Field of Classification Search
CPC .......... B22F 2998/10; B22F 3/15; B22F 9/04; B22F 9/08; C22C 1/1084; C22C 19/07; C23C 14/3414; H01F 41/183
USPC ........................................................ 148/425
See application file for complete search history.

(56) References Cited

U.S. PATENT DOCUMENTS 6,406,600 B1    6/2002 Takashima
6,716,542 B2    4/2004 Uwazumi et al.
(Continued)

FOREIGN PATENT DOCUMENTS

JP    10-088333 A    4/1998
JP    2000-038660 A   2/2000
(Continued)

*Primary Examiner* — Jie Yang
*Assistant Examiner* — Xiaowei Su
(74) *Attorney, Agent, or Firm* — Howson & Howson LLP

(57) ABSTRACT

A ferromagnetic sputtering target comprising metal having a composition containing 20 mol % or less of Cr, and Co as the remainder; wherein the target structure includes a basis metal (A), and flat phases (B), containing 90 wt % or more of Co, within the basis metal (A), the average grain size of the phases (B) is 10 μm or more and 150 μm or less, and the average aspect ratio of the phases (B) is 1:2 to 1:10. Provided is a ferromagnetic sputtering target capable of inhibiting the generation of particles during sputtering, and improving the pass-through flux to achieve a stable electrical discharge with a magnetron sputtering device.

12 Claims, 8 Drawing Sheets

Powder to which Co atomized powder is pulverized is used.

(56) References Cited

U.S. PATENT DOCUMENTS

| | | |
|---|---|---|
| 7,909,949 B2 | 3/2011 | Nakamura et al. |
| 7,927,434 B2 | 4/2011 | Nakamura et al. |
| 2005/0223848 A1 | 10/2005 | Ueno et al. |
| 2007/0209547 A1 | 9/2007 | Irumata et al. |
| 2008/0062575 A1 | 3/2008 | Shimizu |
| 2009/0229976 A1* | 9/2009 | Kato et al. ............... 204/298.13 |
| 2009/0242393 A1 | 10/2009 | Satoh |
| 2009/0308740 A1* | 12/2009 | Kato et al. ............... 204/298.13 |
| 2010/0089622 A1 | 4/2010 | Irumata et al. |
| 2010/0270146 A1 | 10/2010 | Nonaka et al. |
| 2010/0320084 A1 | 12/2010 | Sato |
| 2011/0003177 A1* | 1/2011 | Wu et al. .................... 428/836.2 |
| 2011/0048935 A1 | 3/2011 | Koide |
| 2011/0114879 A1 | 5/2011 | Arakawa et al. |
| 2011/0132757 A1 | 6/2011 | Nakamura et al. |
| 2011/0162971 A1 | 7/2011 | Nakamura et al. |
| 2011/0247930 A1 | 10/2011 | Sato |
| 2011/0284373 A1 | 11/2011 | Sato et al. |
| 2012/0118734 A1 | 5/2012 | Sato et al. |
| 2012/0241316 A1 | 9/2012 | Arakawa |
| 2012/0241317 A1 | 9/2012 | Ikeda et al. |
| 2012/0273347 A1 | 11/2012 | Koide |
| 2013/0001079 A1 | 1/2013 | Sato |
| 2013/0015061 A1 | 1/2013 | Sato |
| 2013/0098760 A1 | 4/2013 | Takami et al. |
| 2013/0112555 A1* | 5/2013 | Ogino et al. ............. 204/298.13 |
| 2013/0134038 A1 | 5/2013 | Sato et al. |
| 2013/0175167 A1 | 7/2013 | Ikeda et al. |
| 2013/0206591 A1 | 8/2013 | Takami et al. |
| 2013/0206592 A1 | 8/2013 | Arakawa et al. |
| 2013/0206593 A1 | 8/2013 | Arakawa et al. |
| 2013/0213802 A1 | 8/2013 | Sato et al. |
| 2013/0213804 A1 | 8/2013 | Arakawa et al. |
| 2013/0220804 A1 | 8/2013 | Arakawa et al. |
| 2013/0248362 A1 | 9/2013 | Ogino et al. |

FOREIGN PATENT DOCUMENTS

| | | |
|---|---|---|
| JP | 2009-001860 A | 1/2009 |
| JP | 2009-132975 A | 6/2009 |

* cited by examiner

Powder to which Co atomized powder is pulverized is used.

Co atomized powder is used.

Co-Cr pulverized powder is used.

Co-Cr atomized powder is used.

Powder to which Co atomized powder is pulverized is used.

Co atomized powder is used.

Co-Cr pulverized powder is used.

Co-Cr atomized powder is used.

SPUTTERING TARGET OF FERROMAGNETIC MATERIAL WITH LOW GENERATION OF PARTICLES

BACKGROUND OF THE INVENTION

The present invention relates to a sputtering target of ferromagnetic material for use in the deposition of a magnetic thin film of a magnetic recording medium, and particularly for use in the deposition of a magnetic recording layer of a hard disk based on the perpendicular magnetic recording system; and to a sputtering target with low generation of particles which enables a stable electrical discharge when sputtered with a magnetron sputtering device since the pass-through flux is large.

In the field of magnetic recording as represented with hard disk drives, a material based on Co, Fe or Ni as ferromagnetic metals is used as the material of the magnetic thin film which is used for the recording. For example, Co—Cr-based or Co—Cr—Pt-based ferromagnetic alloys comprising Co as its main component are used for the recording layer of hard disks based on the longitudinal magnetic recording system.

Moreover, composite materials of Co—Cr—Pt-based ferromagnetic alloys comprising Co as its main component and nonmagnetic inorganic substances are often used for the recording layer of hard disks based on the perpendicular magnetic recording system which was recently put into practical application.

A magnetic thin film of a magnetic recording medium such as a hard disk is often produced by performing sputtering with a ferromagnetic sputtering target having the foregoing materials as its components in light of its high productivity.

As a method of manufacturing this kind of ferromagnetic sputtering target, the melting method or the powder-metallurgical method may be considered. It is not necessarily appropriate to suggest which method is better since it will depend on the demanded characteristics, but a sputtering target composed of ferromagnetic alloys and nonmagnetic inorganic grains, which is used for forming the recording layer of hard disks based on the perpendicular magnetic recording system, is generally manufactured with powder metallurgy. This is because the inorganic grains need to be uniformly dispersed within the alloy basis material, and this is difficult to achieve with the melting method.

For example, proposed is a method of obtaining a sputtering target for a magnetic recording medium including the steps of mixing the powder, which is obtained by mixing Co powder, Cr powder, $TiO_2$ powder and $SiO_2$ powder, with the spherical Co powder with a sun-and-planet motion-type mixer, and molding the mixed powder with hot pressing (Patent Document 1).

In the foregoing case, it can be observed that the target structure includes spherical phases (B) in a basis metal phase (A) in which inorganic grains are uniformly dispersed (FIG. 1 of Patent Document 1). Although this kind of structure is favorable from the perspective of improving the pass-through flux, it is not necessarily favorable as a sputtering target for a magnetic recording medium from the perspective of inhibiting the generation of particles during sputtering.

Moreover, proposed is a method of obtaining a sputtering target for a Co-based alloy magnetic film by mixing $SiO_2$ powder to Co—Cr—Ta alloy powder prepared with the atomization method, subsequently performing mechanical alloying thereto with a ball mill to disperse the oxides in the Co—Cr—Ta alloy powder, and molding this with hot pressing (Patent Document 2).

Although the drawings are unclear, the target structure in the foregoing case comprises a shape in which black portions ($SiO_2$) are surrounding a large white spherical structure (Co—Cr—Ta alloy). This kind of structure is also not necessarily favorable as a sputtering target for a magnetic recording medium.

In addition, proposed is a method of obtaining a sputtering target for forming a thin film for use in a magnetic recording medium by mixing Co—Cr binary alloy powder, Pt powder and $SiO_2$ powder, and hot pressing the obtained mixed powder (Patent Document 3).

Although the target structure in the foregoing case is not shown in the drawings, it is described that the observation result was that there are a Pt phase, a $SiO_2$ phase and a Co—Cr binary alloy phase in the target structure and a diffusion layer exists around the Co—Cr binary alloy layer. This kind of structure is also not necessarily favorable as a sputtering target for a magnetic recording medium.

There are various types of sputtering devices, but a magnetron sputtering device comprising a DC power source is broadly used in light of its high productivity for the deposition of the foregoing magnetic recording film. This sputtering method is to place a positive electrode substrate and a negative electrode target opposite each other, and generate an electric field by applying high voltage between the substrate and the target under an inert gas atmosphere.

Here, the sputtering method employs a principle where inert gas is ionized, plasma composed of electrons and positive ions is formed, the positive ions in this plasma collide with the target (negative electrode) surface to discharge the constituent atoms of the target, and the extruded atoms adhere to the opposing substrate surface to form a film. As a result of performing the sequential process described above, the material configuring the target is deposited on the substrate.

[Patent Document 1] Japanese Patent Application No. 2010-011326
[Patent Document 2] Japanese Laid-Open Patent Publication No. H10-088333
[Patent Document 3] Japanese Laid-Open Patent Publication No. 2009-1860

SUMMARY OF INVENTION

Generally speaking, if a magnetron sputtering device is used to perform sputtering with a ferromagnetic sputtering target; since much of the magnetic flux from the magnet will pass through the target, which is a ferromagnetic body, the pass-through flux will decrease, and there is a major problem in that a discharge does not occur during the sputtering or the discharge is unstable even if a discharge does occur.

In order to overcome this problem, known is a method of inputting coarse metal grains of approximately 30 to 150 μm during the production process of the sputtering target in order to intentionally obtain an uneven target structure. Nevertheless, in the foregoing case, the sinterability of the coarse metal grains and the matrix is often insufficient, and the coarse metal grains become a coarse phase that is different from the matrix component after the sintering. Thus, there is a problem in that the coarse phase in the target flakes off during the sputtering and generates particles. Moreover, since there is a difference in the erosion speed between the coarse phase, which is different from the matrix component, and the matrix; this could result in that an abnormal discharge occurs at the interface thereof and causes the generation of particles.

As described above, even with magnetron sputtering, it has been possible to achieve a stable discharge by increasing the pass-through flux, but particles tend to increase because the coarse phase, which is different from the matrix component, flakes off during the sputtering.

In light of the foregoing problems, an object of this invention is to provide a ferromagnetic sputtering target, which is capable of obtaining a stable electrical discharge when sputtered with a magnetron sputtering device, with low generation of particles, and with improved pass-through flux.

In order to achieve the foregoing object, as a result of intense study, the present inventors discovered that a target with a large pass-through flux and low generation of particles can be obtained by adjusting the target structure.

Based on the foregoing discovery, the present invention provides:

1) A sputtering target of ferromagnetic material comprising metal having a composition containing 20 mol % or less of Cr, and Co as the remainder; wherein the target structure includes a basis metal (A), and flat phases (B), containing 90 wt % or more of Co, within the basis metal (A), the average grain size of the phases (B) is 10 μm or more and 150 μm or less, and the average aspect ratio of the phases (B) is 1:2 to 1:10.

The present invention additionally provides:

2) A sputtering target of ferromagnetic material comprising metal having a composition containing 20 mol % or less of Cr, 5 mol % or more and 30 mol % or less of Pt, and Co as the remainder; wherein the target structure includes a basis metal (A), and flat phases (B), containing 90 wt % or more of Co, within the basis metal (A), the average grain size of the phases (B) is 10 μm or more and 150 μm or less, and the average aspect ratio of the phases (B) is 1:2 to 1:10.

The present invention further provides:

3) The sputtering target of ferromagnetic material according to 1) or 2) above, containing 0.5 mol % or more and 10 mol % or less of one or more elements selected from B, Ti, V, Mn, Zr, Nb, Ru, Mo, Ta, and W as additive elements.

The present invention additionally provides:

4) The sputtering target of ferromagnetic material according to any one of 1) to 3) above, wherein the area ratio occupied by the phases (B) in the cross section of the sputtering target is 15 to 50%.

The present invention further provides:

5) The sputtering target of ferromagnetic material according to any one of 1) to 4) above, wherein the basis metal (A) contains one or more components of inorganic material selected from carbon, oxides, nitrides, carbides and carbo-nitrides.

A target that is adjusted as described above has a large pass-through flux, and stable electrical discharge can be obtained since ionization of inert gas will efficiently advance when the target is used in a magnetron sputtering device. Moreover, since the thickness of the target can be made thick, there is an advantage in that the replacement frequency of the target can be reduced, and a magnetic thin film can be produced with low cost. Moreover, since the generation of particles is low, there is an advantage in that defective magnetic recording films obtained by sputter deposition can be reduced, and costs can therefore be reduced.

DETAILED DESCRIPTION OF THE INVENTION

The main component configuring the ferromagnetic sputtering target of the present invention is a metal containing 20 mol % or less of Cr and Co as the remainder; or a metal containing 20 mol % or less of Cr, 5 mol % or more and 30 mol % or less of Pt, and Co as the remainder. Note that Cr is added as an essential component and 0 mol % of Cr is therefore excluded from the foregoing range. Specifically, Cr is contained in an amount that is greater than the analyzable lower limit. If the Cr content is 20 mol % or less, an effect is yielded even in cases of adding trace amounts. The present invention covers all of the above.

These are components which are required as the magnetic recording medium, and, although the blending ratio may be variously changed within the foregoing range, they are able to maintain characteristics as an effective magnetic recording medium.

What is important in the present invention is that the target structure includes flat phases (B) containing 90 wt % or more of Co, the average grain size of the phases (B) is 10 μm or more and 150 μm or less, the average aspect ratio of the phases (B) is 1:2 to 1:10, and the phases (B) are of a different component from the basis metal (A) and are of a structure that the phases (B) are separated from each other by the basis metal (A).

The term "flat" or "flat shape" as used in this invention refers to a shape of a wedge, crescent, or quarter moon, or a shape where two or more of these shapes being connected. Moreover, when these shapes are defined quantitatively, the ratio of the short diameter and the long diameter (hereinafter referred to as the "aspect ratio") is, on average, 1:2 to 1:10.

Incidentally, the term "flat" or "flat shape" is referring to the shape when viewed from the top, and does not mean a completely level shape without any unevenness. In other words, shapes with slight undulation and unevenness are also included in the foregoing term.

With a target having this kind of structure, it is possible to prevent, based on the wedge effect by shaping the spherical Co atomized powder in the form of a wedge, the generation of particles caused by the flaking off of the phases (B) during sputtering. Moreover, by destroying the spherical shape, it is possible to reduce the deviation in the erosion speed that occurred when the atomized powder was of a spherical shape, and inhibit the generation of particles caused at the interface between two materials having different erosion speeds.

Figure 1:
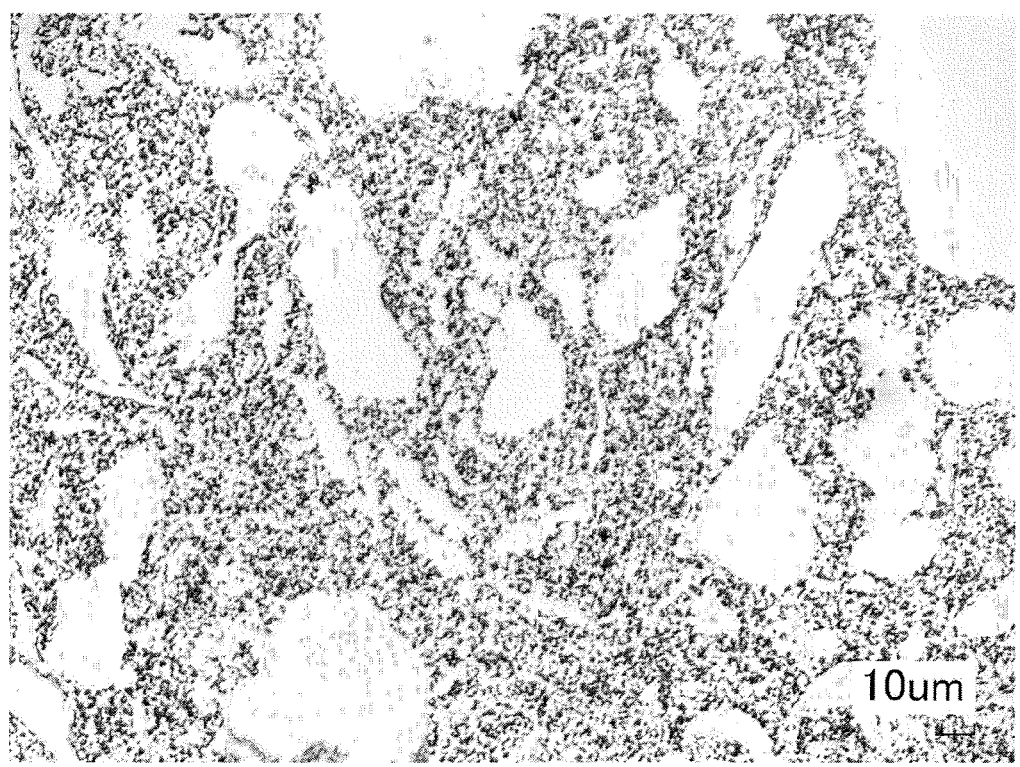
FIG. 1 This is a structure image upon observing the polished surface of the target of Example 1 under an optical microscope.

Preferably, the average grain size of the phases (B) is 10 μm or more and 150 μm or less. As shown in FIG. 1, fine grains of inorganic materials (one or more components selected from carbon, oxides, nitrides and carbides) exist in the basis metal (A) (the black portions finely dispersed in FIG. 1 are the grains of the inorganic materials). If the diameter of phase (B)

is less than 10 µm, the difference in grain size between the grains of the inorganic materials and the coexisting metal will become small. Thus, although the diffusion rate of the phase (B) is slow upon sintering the target material since it is of a spherical shape, the diffusion itself will advance, and the existence of the phase (B) will become unclear as the diffusion advances.

Meanwhile, if the diameter of phase (B) exceeds 150 µm, the smoothness of the target surface is lost as the sputtering process advances, and the problem of particles tends to arise. Accordingly, the size of the phase (B) is desirably 10 to 150 µm.

Moreover, in the present invention, the phase (B) is a phase which has Co as its main component and contains 90 wt % or more of Co. In the foregoing case, it is possible to obtain a target with a large pass-through flux and a stable discharge, and the target comprises favorable characteristics as a sputtering target of ferromagnetic material. In order to maintain the foregoing maximum magnetic permeability of the flat phase (B), it is desirable that the Co concentration is high as possible.

Although pure Co is used as the raw material, since the flat phase (B) mutually diffuses with the basis metal (A) nearby during the sintering process, the Co content of the phase (B) is preferably 90 wt % or more, more preferably 95 wt % or more, and most preferably 97 wt % or more.

Note that the Co content of the phase (B) can be measured with EPMA. Moreover, any other analytical method capable of measuring the Co content of phase (B) may be similarly applied without restriction.

Co is the main component as described above, but the tendency is for its center to have high purity and its periphery to have slightly lower purity. In the range (hereinafter referred to the "vicinity of center") of a phase of similarity (flat) shape on the assumption that the diameter (long diameter and short diameter, respectively) of the flat phase (B) was reduced to ⅓; it is possible to achieve the Co concentration of 97 wt % or more, and the present invention covers all of the above.

In the present invention, it is also possible to contain 0.5 mol % or more and 10 mol % or less of one or more elements selected from B, Ti, V, Mn, Zr, Nb, Ru, Mo, Ta, and W as additive elements. These are elements which are added as needed in order to improve the characteristics as a magnetic recording medium.

Moreover, the ferromagnetic sputtering target of the present invention can contain one or more of inorganic materials selected from carbon, oxides, nitrides, carbides or carbonitrides in the basis metal in a dispersed state. In the foregoing case, the present invention comprises favorable characteristics as a material of a magnetic recording film with a granular structure; particularly a recording film of a hard disk drive based on the perpendicular magnetic recording system.

A target that is adjusted as described above becomes a target with a large pass-through flux, and stable electrical discharge can be obtained since ionization of inert gas will efficiently advance when this target is used in a magnetron sputtering device. Moreover, since the thickness of the target can be made thick, there is an advantage in that the replacement frequency of the target can be reduced, and a magnetic thin film can be produced with low cost.

In addition, as a result of being able to reduce the deviation of the erosion speed and prevent the omission of phases, there is also an advance in that the generation of particles, which cause the deterioration in the production yield, can be reduced.

The ferromagnetic sputtering target of the present invention is manufactured with the melting method or powder metallurgy. In the case of powder metallurgy, the powders of the respective metal elements, and as needed, the powders of the additive metal elements are prepared. Desirably, the maximum grain size of these powders is 20 µm or less. Moreover, the alloy powders of these metals may also be prepared in substitute for the powders of the respective metal elements, but it is desirable that the maximum grain size is also 20 µm or less in the foregoing case.

Meanwhile, if the grain size is too small, there is a problem in that oxidation is promoted and the component composition will not fall within the intended range. Thus, it is desirable that the grain size is 0.1 µm or more.

Subsequently, these metal powders are weighed to the intended composition, mixed and pulverized with well-known methods such as ball milling. If inorganic powder is to be added, it should be added and mixed with the metal powders at this stage.

Carbon powder, oxide powder, nitride powder, carbide powder or carbonitride powder is prepared as the inorganic powder, and it is desirable that the maximum grain size of the inorganic powder is 5 µm or less. Meanwhile, if the grain size is too small, the powders become clumped together, and the grain size is desirably 0.1 µm or more.

In addition, Co atomized powder with a diameter within the range of 50 to 300 µm is prepared, and the Co atomized powder and the foregoing mixed powder are pulverized and further mixed using a high-energy ball mill. The Co atomized powder becomes a flat shape, and pulverizing and mixing are performed until the average grain size becomes 150 µm or less. Here, the high-energy ball mill that is used is able to pulverize and mix the raw powders in a short period of time in comparison to a ball mill or a vibrating mill.

Otherwise, the prepared Co atomized powder with a diameter within the range of 50 to 300 µm can be pulverized alone and sieved to prepare flat coarse grains of an average diameter within the range of 10 to 150 µm, and this may be mixed with the foregoing mixed powder. As the mixing device, a mixer or a mortar without pulverizing force is preferably used. Moreover, mixing is preferably performed in an inert gas atmosphere or a vacuum in consideration of the problem of oxidation of the metal components during the mixing process.

The powder obtained as described above is molded and sintered using a vacuum hot press device and this is cut into the intended shape in order to prepare the ferromagnetic sputtering target of the present invention. Note that the foregoing Co powder of which the shape was destroyed by pulverization corresponds to the flat phase (B) that is observed in the target structure.

Moreover, the molding and sintering processes are not limited to hot press, and the plasma discharge sintering method or the hot isostatic sintering method may also be used. The holding temperature during sintering is preferably set to the lowest temperature within the temperature range in which the target will become sufficiently densified. Although this will depend on the target composition, in many cases the temperature is within the range of 800 to 1200° C. Moreover, the pressure during sintering is preferably 300 to 500 kg/cm$^2$.

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1, and Comparative Example 1

In Example 1, Co powder with an average grain size of 3 μm, Cr powder with an average grain size of 5 μm, SiO₂ powder with an average grain size of 1 μm, and Co atomized powder with a diameter within the range of 50 to 150 μm were prepared as the raw powders. The Co powder, Cr powder, SiO₂ powder, and Co atomized powder were respectively weighed to achieve a target composition of 78.73 Co-13.07 Cr-8.2 SiO₂ (mol %).

Subsequently, the Co powder, Cr powder and SiO₂ powder were placed, together with zirconia balls as the grinding medium, in a ball mill pot with a capacity of 10 liters, and it was rotated for 20 hours to mix the raw powders. The obtained mixed powder and the Co atomized powder were placed in a high-energy ball mill to be pulverized and mixed.

This mixed powder was filled in a carbon mold, and hot pressed in a vacuum atmosphere under the following conditions; namely, temperature of 1110° C., holding time of 2 hours, and welding pressure of 30 MPa; to obtain a sintered compact. This was further cut with a lathe to obtain a disk-shaped target with a diameter of 180 mm and thickness of 5 mm.

(Evaluation of Number of Particles)

Since it is difficult to observe the difference in the number of particles with a film thickness that is generally used in products (thickness of a recording layer is 5 to 10 nm), the evaluation of the number of particles was performed by increasing the film thickness approximately 200 times (thickness of 1000 nm) in comparison to the usual film thickness and thereby increasing the absolute number of particles. The results are shown in Table 1.

(Measurement Method of Pass-through Flux)

Moreover, the pass-through flux was measured according to ASTM F2086-01 (Standard Test Method for Pass Through Flux of Circular Magnetic Sputtering Targets, Method 2). The pass-through flux density measured by fixing the target center and rotating it 0 degrees, 30 degrees, 60 degrees, 90 degrees, and 120 degrees was divided by the value of the reference field defined in the ASTM and represented in percentage by multiplying 100 thereto. The result of averaging the foregoing five points is indicated in Table 1 as the average pass-through flux density (%).

(Measurement Method of Co Content and Size of Flat Phase (B))

The Co content of the flat phase (B) of Example 1 was 98 wt % or more in the vicinity of center of the phase (B). Moreover, the size of the flat phase (B) was measured by counting the number of flat phases (B) in a segment of 30 cm on a photograph enlarged 220 times of a cut plane of a sintered compact (including a sputtering target), and obtaining the average value (μm) of the cut length thereof. The results are shown as the average grain size in Table 1.

(Measurement Method of Aspect Ratio of Flat Phase (B))

Moreover, the aspect ratio of the phase (B) was measured by observing the cut plane of a sintered compact (including a sputtering target) under a microscope, measuring the short diameter and long diameter of the flat phases (B) existing in the viewing field enlarged 220 times, and taking the average thereof. This process was performed at five arbitrary viewing fields and the measured values were averaged. Note that flat phases (B) contained in only a part of the viewing field were excluded. Moreover, the flat phases (B) were measured only for those with a short diameter of 4 μm or more. The results are shown in Table 1.

Although not indicated in the Tables, the area ratio occupied by the flat phases (B) can be obtained by observing the cut plane of a sintered compact (including a sputtering target) under a microscope, measuring the area of the flat phases (B) existing in the viewing field enlarged 220 times, and dividing this by the overall area of the viewing field. Moreover, this process may be performed at five arbitrary viewing fields and the measured values are averaged in order to improve the accuracy. Note that, as with the measurement of the aspect ratio, flat phases (B) contained in only a part of the viewing field were excluded. Moreover, the flat phases (B) were measured only for those with a short diameter of 4 μm or more. The results were 15% or more and 50% or less.

Although not indicated in the Tables, the existence ratio of grains having the intended shape among the flat phases (B) was measured by observing the cut plane of a sintered compact under a microscope, counting the number of grains having the intended shape (flat shape including a wedge shape and the like) among the flat phases (B) existing in the viewing field enlarged 220 times, and dividing this by the number of flat phases (B) existing in the overall viewing field. This process was performed at five arbitrary viewing fields and the measured values were averaged. Note that flat phases (B) contained in only a part of the viewing field were excluded. Moreover, the flat phases (B) were measured only for those with a short diameter of 4 μm or more. The results were 90% or more.

In Comparative Example 1, Co powder with an average grain size of 3 μm, Cr powder with an average grain size of 5 μm, SiO₂ powder with an average grain size of 1 μm, and Co atomized powder with a diameter within the range of 30 to 150 μm were prepared as the raw powders. The Co powder, Cr powder, SiO₂ powder, and Co atomized powder were respectively weighed to achieve a target composition of 78.73 Co-13.07 Cr-8.2 SiO₂ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This was further cut with a lathe to obtain a disk-shaped target with a diameter of 180 mm and thickness of 5 mm. The number of particles was counted, and the average pass-through flux density was measured. The results are shown in Table 1.

TABLE 1

|  |  | Average grain size (μm) | Aspect ratio of phase (B) | Number of particles in steady state | PTF (%) |
|---|---|---|---|---|---|
| Example 1 | Powder to which Co atomized powder is pulverized (placed in high-energy ball mill) | 70 | 1:5 | 12.3 | 54.0 |
| Comparative Example 1 | Co atomized powder | 30 | 1:1 | 29.3 | 60.6 |

PTF (%): Pass-through flux density

As shown in Table 1, the number of particles in a steady state in Example 1 was 12.3 particles, and it was confirmed that the number decreased in comparison to the 29.3 particles in Comparative Example 1. Moreover, the average pass-through flux density in Example 1 was 54.0%, and decreased in comparison to the 60.6% in Comparative Example 1, but a target with higher pass-through flux density than conventional technology could be obtained. Moreover, as a result of observation with an optical microscope, the average grain size was 70 μm and it was larger than the 30 μm in Comparative Example 1. It was confirmed that the aspect ratio of the phase (B) was 1:5 and the phase (B) has a flat shape. Note that the Co content in Comparative Example 1 was 98 wt % in the vicinity of center of the phase (B).

Figure 2:
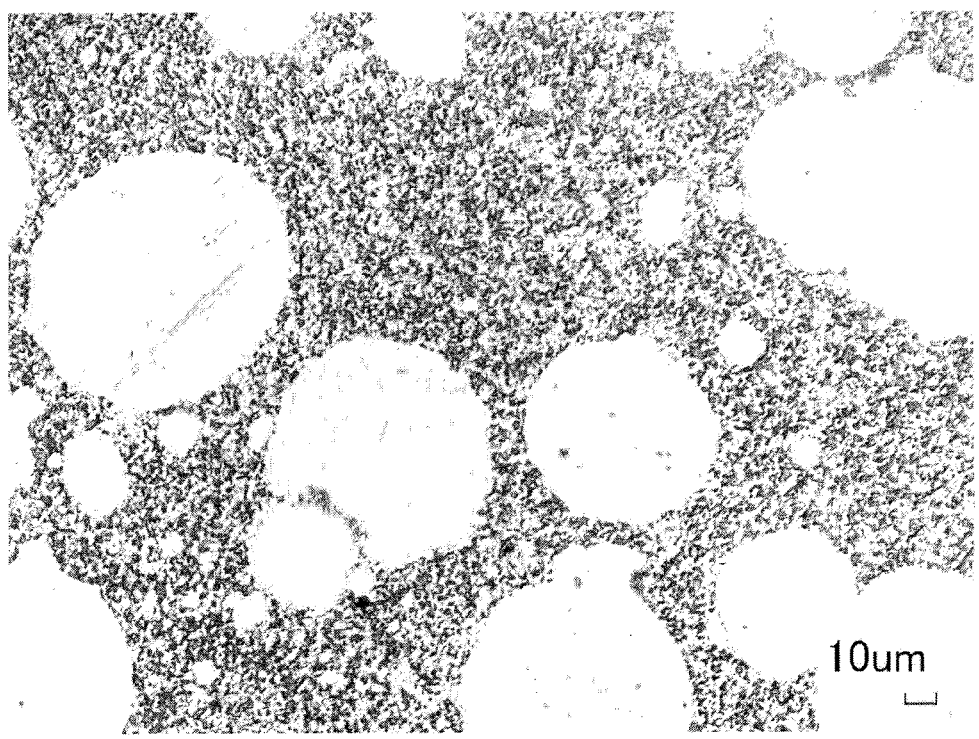
FIG. 2 This is a structure image upon observing the polished surface of the target of Comparative Example 1 under an optical microscope.

The structure image upon observing the polished target surface of Example 1 under an optical microscope is shown in FIG. 1, and such structure image of Comparative Example 1 is shown in FIG. 2. The blackish portions in FIG. 1 correspond to the basis metal (A) with inorganic grains uniformly dispersed therein. The whitish portions are the flat phases (B). As shown in with structure image of FIG. 1, what is extremely unique in Example 1 is that the phases (B) dispersed in the basis metal, in which $SiO_2$ grains are micro-dispersed, have a flat shape (wedge shape).

Meanwhile, in FIG. 2, which is a structure image of the polished surface of the target obtained in Comparative Example 1, the phases (B) dispersed in the basis metal have a spherical shape, and flat-shaped ones were not observed anywhere.

Figure 5:
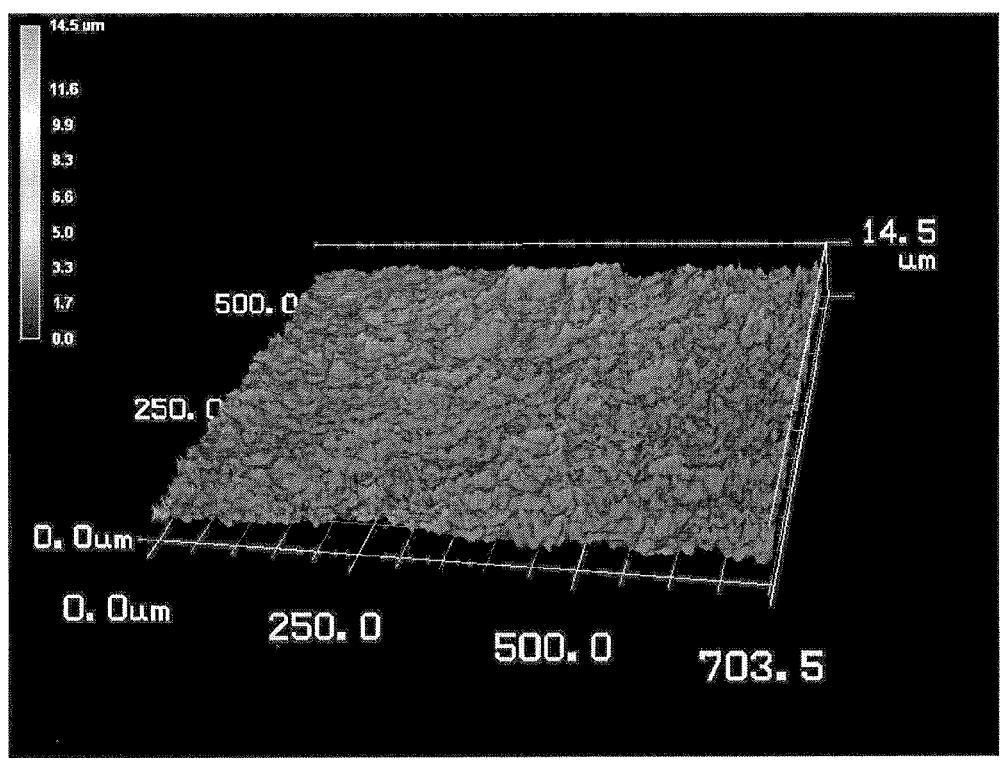
FIG. 5 This is a three-dimensional image of the erosion surface of the target of Example 1.
Figure 6:
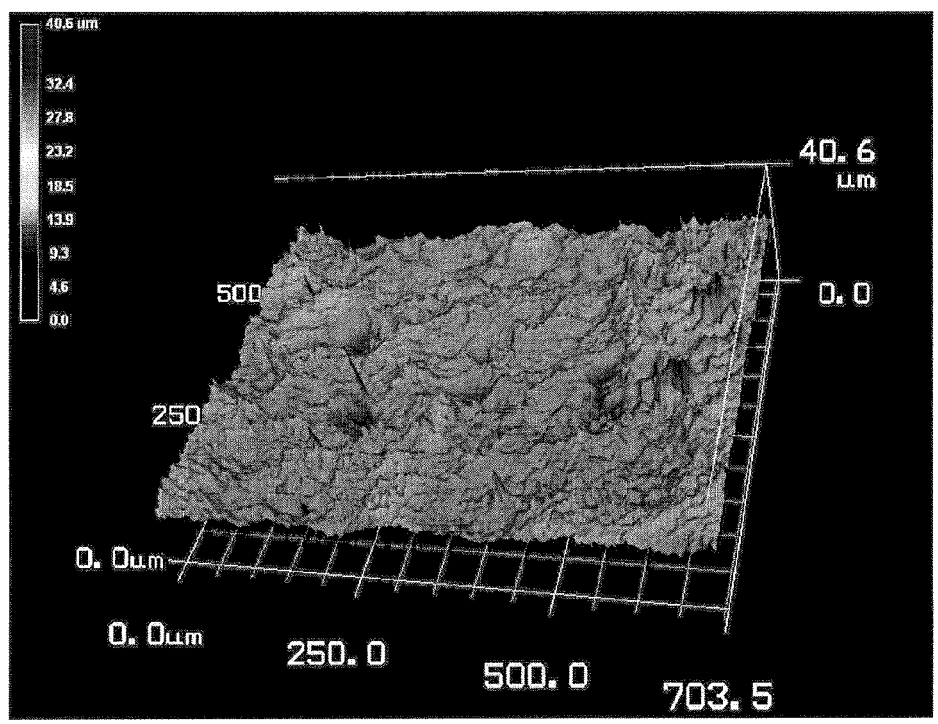
FIG. 6 This is a three-dimensional image of the erosion surface of the target of Comparative Example 1.

Moreover, the three-dimensional image of the erosion surface of the target of Example 1 is shown in FIG. 5, and such three-dimensional image of Comparative Example 1 is shown in FIG. 6. With Comparative Example 1 with numerous particles, it was confirmed that there were numerous cratered traces as though the spherical atomized powder was shed. Meanwhile, in FIG. 5, which is a three-dimensional image of the erosion surface of the target obtained in Example 1, no traces as though the atomized powder was shed could be confirmed.

Example 2, and Comparative Example 2

In Example 2, Co powder with an average grain size of 3 μm, Cr powder with an average grain size of 5 μm, $SiO_2$ powder with an average grain size of 1 μm, and Co—Cr pulverized powder with a diameter within the range of 30 to 150 μm were prepared as the raw powders. The Co powder, Cr powder, $SiO_2$ powder, and Co—Cr pulverized powder were respectively weighed to achieve a target composition of 78.73 Co-13.07 Cr-8.2 $SiO_2$ (mol %).

Subsequently, the Co powder, Cr powder and $SiO_2$ powder were placed, together with zirconia balls as the grinding medium, in a ball mill pot with a capacity of 10 liters, and it was rotated for 20 hours to mix the raw powders. The obtained mixed powder and the Co—Cr pulverized powder were further mixed for 10 minutes in a sun-and-planet motion-type mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa; to obtain a sintered compact. This was further processed with a lathe to obtain a disk-shaped target with a diameter of 180 mm and thickness of 5 mm. The number of particles was counted, and the average pass-through flux density was measured. The results are shown in Table 2. The Co content in Example 2 was 99 wt % in the vicinity of center of the phase (B).

In Comparative Example 2, Co powder with an average grain size of 3 μm, Cr powder with an average grain size of 5 μm, $SiO_2$ powder with an average grain size of 1 μm, and Co—Cr atomized powder with a diameter within the range of 30 to 150 μm were prepared as the raw powders. The Co powder, Cr powder, $SiO_2$ powder, and Co—Cr atomized powder were respectively weighed to achieve a target composition of 78.73 Co-13.07 Cr-8.2 $SiO_2$ (mol %).

These powders were placed, together with zirconia balls as the grinding medium, in a ball mill pot with a capacity of 10 liters, and it was rotated for 20 hours to mix the raw powders.

Subsequently, the foregoing mixed powder was filled in a carbon mold, and hot pressed in a vacuum atmosphere under the following conditions; namely, temperature of 1100° C., holding time of 2 hours, and welding pressure of 30 MPa; to obtain a sintered compact. This was further cut with a lathe to obtain a disk-shaped target with a diameter of 180 mm and thickness of 5 mm. The number of particles was counted, and the average pass-through flux density was measured. The results are shown in Table 2.

TABLE 2

| | | Average grain size (μm) | Aspect ratio of phase (B) | Number of particles in steady state | PTF (%) |
|---|---|---|---|---|---|
| Example 2 | Co—Cr pulverized powder | 50 | 1:3 | 21.3 | 46.6 |
| Comparative Example 2 | Co—Cr atomized powder | 40 | 1:1 | 166.7 | 52.6 |

PTF (%): Pass-through flux density

As shown in Table 2, the number of particles in a steady state in Example 2 was 21.3 particles, and it was confirmed that the number decreased considerably in comparison to the 166.7 particles in Comparative Example 2. Note that the Co content in the vicinity of center of Comparative Example 2 was 98 wt %.

Moreover, the average pass-through flux density in Example 2 was 46.6%, and decreased in comparison to the 52.6% in Comparative Example 2, but a target with higher pass-through flux density than conventional technology (approximately 45.0%) could be obtained. Moreover, as a result of observation with an optical microscope, the average grain size was 50 μm and it was larger than the 40 μm in Comparative Example 2. It was confirmed that the aspect ratio of the phase (B) was 1:3 and the phase (B) has a flat shape.

Figure 3:
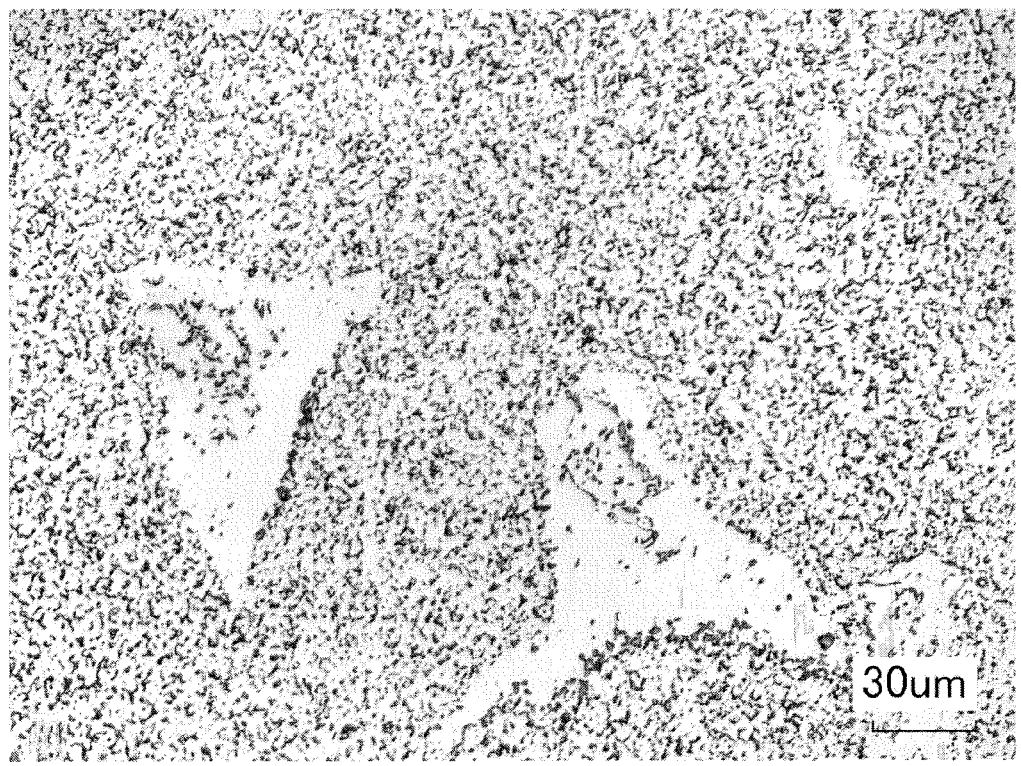
FIG. 3 This is a structure image upon observing the polished surface of the target of Example 2 under an optical microscope.
Figure 4:
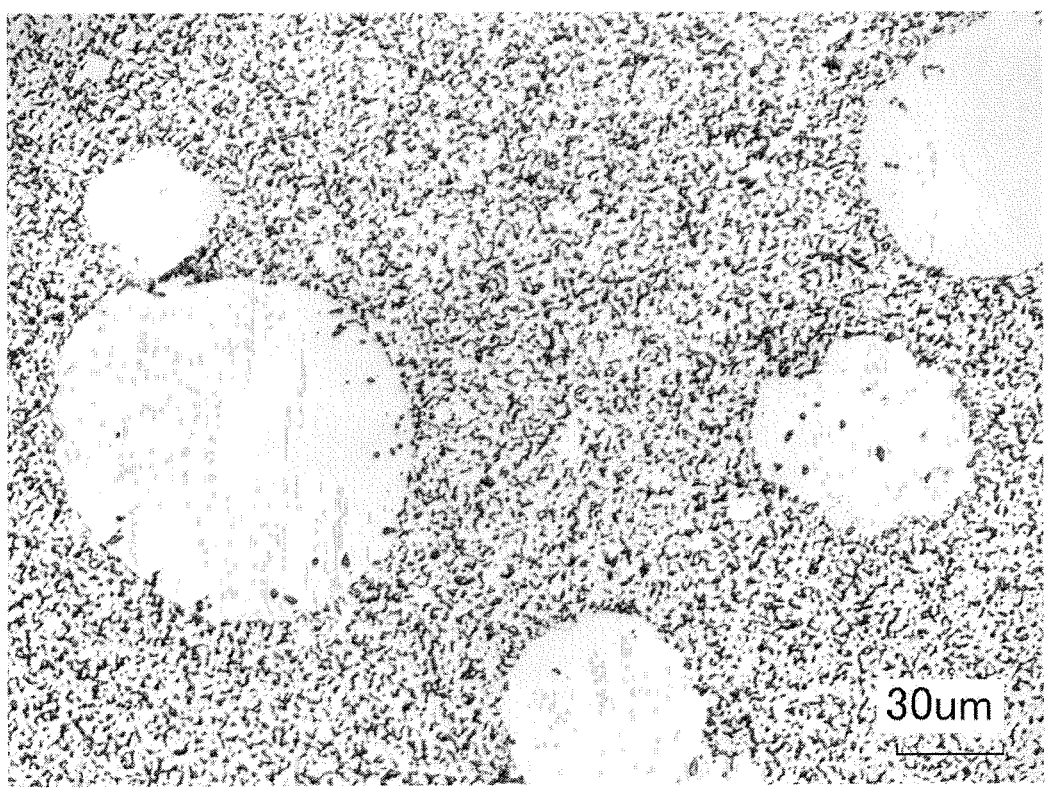
FIG. 4 This is a structure image upon observing the polished surface of the target of Comparative Example 2 under an optical microscope.

The structure image upon observing the polished target surface of Example 2 under an optical microscope is shown in FIG. 3, and such structure image of Comparative Example 2 is shown in FIG. 4. The blackish portions in FIG. 3 correspond to the basis metal (A) with inorganic grains uniformly dispersed therein. The whitish portions are the flat phases (B). As shown in with structure image of FIG. 3, what is extremely unique in Example 2 is that the phases (B) dispersed in the basis metal, in which $SiO_2$ grains are micro-dispersed, have a flat shape (wedge shape).

Meanwhile, in FIG. 4, which is a structure image of the polished surface of the target obtained in Comparative Example 2, the phases (B) dispersed in the basis metal have a spherical shape, and flat-shaped ones were not observed anywhere.

Figure 7:
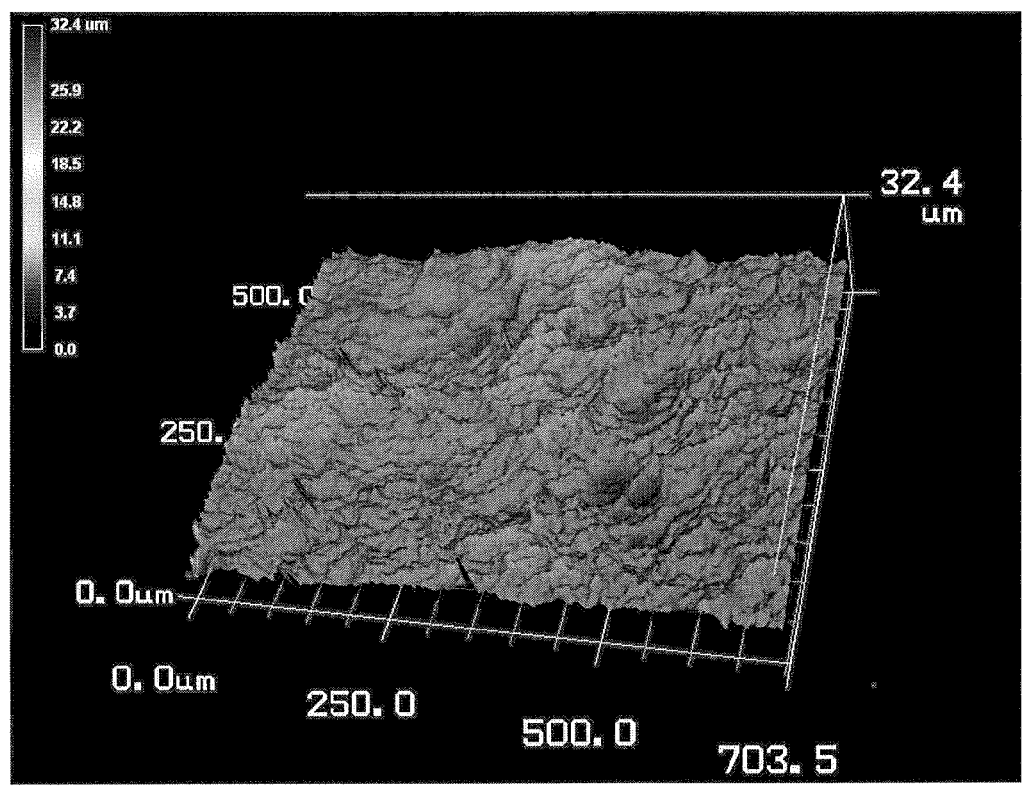
FIG. 7 This is a three-dimensional image of the erosion surface of the target of Example 2.
Figure 8:
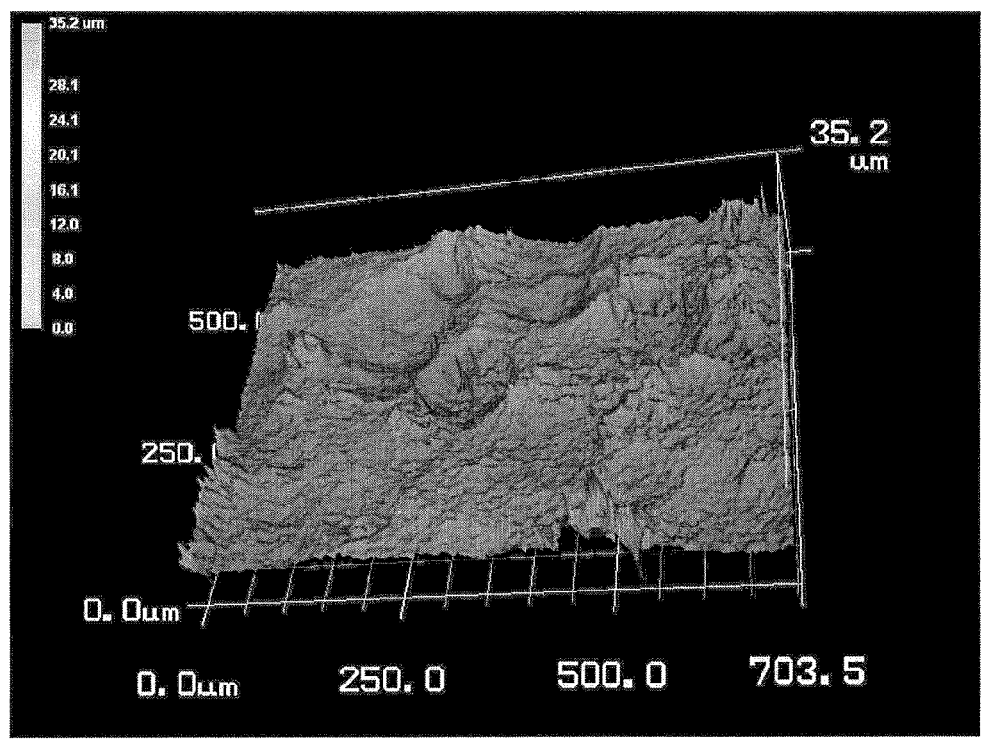
FIG. 8 This is a three-dimensional image of the erosion surface of the target of Comparative Example 2.

Moreover, the three-dimensional image of the erosion surface of the target of Example 2 is shown in FIG. 7, and such three-dimensional image of Comparative Example 2 is shown in FIG. 8. With Comparative Example 2 with numerous particles, it was confirmed that there were numerous cratered traces as though the spherical atomized powder was shed. Meanwhile, in FIG. 7, which is a three-dimensional image of the erosion surface of the target obtained in Example 2, no traces as though the atomized powder was shed could be confirmed.

In both Examples 1 and 2, it was confirmed that there were a basis metal (A), and phases (B), which are surrounded by the basis metal (A), have a flat shape with a diameter within the range of 10 to 150 μm, and contain Co at 97 wt % or more in the vicinity of center thereof. Moreover, the average aspect ratio was within the range of 1:2 to 1:10.

As a result of the phase (B) having this kind of flat shape, the flaking off of the phases (B) from the sputtering target was inhibited due to the so-called wedge effect. Moreover, since the phase (B) has a complex shape, it is possible to reduce the difference in the erosion speed in comparison to the basis metal (A) in which the phases and oxide grains are uniformly dispersed, and consequently the erosion become uniform.

It is evident that this kind of structure plays an extremely important role in inhibiting the generation of particles, causing the erosion to be uniform, and improving the pass-through flux.

The present invention is able to significantly inhibit the generation or particles and improve the pass-through flux by adjusting the structure of the ferromagnetic sputtering target.

Accordingly, by using the target of the present invention, a stable discharge can be obtained during sputtering performed with a magnetron sputtering device. In addition, since the target thickness can be increased, the target life can be prolonged and a magnetic thin film can be manufactured with low cost. Moreover, the quality of the film formed with sputtering can be significantly improved. The present invention is useful as a ferromagnetic sputtering target for use in the deposition of a magnetic thin film of a magnetic recording medium, and particularly of a recording layer of a hard disk drive.

The invention claimed is:

1. A sputtering target of ferromagnetic material comprising metal having a composition containing 20 mol % or less of Cr, and Co as the remainder; wherein the target structure includes a basis metal CoCr alloy (A), and flat phases (B), containing 90 wt % or more of Co, within the basis metal (A), the average grain size of the phases (B) is 10 μm or more and 150 μm or less, and the average aspect ratio of the phases (B) is 1:2 to 1:10.

2. A sputtering target of ferromagnetic material comprising metal having a composition containing 20 mol % or less of Cr, 5 mol % or more and 30 mol % or less of Pt, and Co as the remainder; wherein the target structure includes a basis metal CoCrPt (A), and flat phases (B), containing 90 wt % or more of Co, within the basis metal (A), the average grain size of the phases (B) is 10 μm or more and 150 μm or less, and the average aspect ratio of the phases (B) is 1:2 to 1:10.

3. The sputtering target of ferromagnetic material according to claim 2, containing 0.5 mol % or more and 10 mol % or less of one or more elements selected from B, Ti, V, Mn, Zr, Nb, Ru, Mo, Ta and W as additive elements.

4. The sputtering target of ferromagnetic material according to claim 3, wherein the area ratio occupied by the phases (B) in the cross section of the sputtering target is 15 to 50%.

5. The sputtering target of ferromagnetic material according to claim 4, wherein the basis metal CoCrPt (A) contains one or more components of inorganic material selected from carbon, oxides, nitrides, carbides and carbonnitrides.

6. The sputtering target of ferromagnetic material according to claim 2, wherein an area ratio occupied by the phases (B) in a cross section of the sputtering target is 15 to 50%.

7. The sputtering target of ferromagnetic material according to claim 2, wherein the basis metal CoCrPt (A) contains one or more components of inorganic material selected from the group consisting of carbon, oxides, nitrides, carbides and carbonnitrides.

8. The sputtering target of ferromagnetic material according to claim 1, containing 0.5 mol % to 10 mol % of one or more additive elements selected from the group consisting of B, Ti, V, Mn, Zr, Nb, Ru, Mo, Ta and W.

9. The sputtering target of ferromagnetic material according to claim 8, wherein an area ratio occupied by the phases (B) in a cross section of the sputtering target is 15 to 50%.

10. The sputtering target of ferromagnetic material according to claim 9, wherein the basis metal CoCr (A) contains one or more components of inorganic material selected from the group consisting of carbon, oxides, nitrides, carbides and carbonnitrides.

11. The sputtering target of ferromagnetic material according to claim 1, wherein an area ratio occupied by the phases (B) in a cross section of the sputtering target is 15 to 50%.

12. The sputtering target of ferromagnetic material according to claim 1, wherein the basis metal CoCr (A) contains one or more components of inorganic material selected from the group consisting of carbon, oxides, nitrides, carbides and carbonnitrides.

* * * * *